United States Patent [19]
Komenaka

[11] Patent Number: 5,089,879
[45] Date of Patent: Feb. 18, 1992

[54] RESIN SEAL TYPE SEMICONDUCTOR DEVICE

[75] Inventor: Kazuichi Komenaka, Kawasaki, Japan

[73] Assignee: Kabushiki Kaisha Toshiba, Kawasaki, Japan

[21] Appl. No.: 667,335

[22] Filed: Mar. 11, 1991

[30] Foreign Application Priority Data

Mar. 13, 1990 [JP] Japan ................. 2-62037

[51] Int. Cl.⁵ ........................... H01L 23/28
[52] U.S. Cl. ........................ 357/72; 357/70; 357/69
[58] Field of Search ............ 357/72, 70; 11/69, 74

[56] References Cited

U.S. PATENT DOCUMENTS

| 4,661,837 | 4/1987 | Sono | 357/72 |
| 4,814,943 | 3/1989 | Okuaki | 357/72 |
| 4,985,751 | 1/1991 | Shiobara et al. | 357/72 |

FOREIGN PATENT DOCUMENTS

| 0080230 | 5/1985 | Japan | 357/69 |
| 0169051 | 7/1988 | Japan | 357/72 |

Primary Examiner—Georgia Epps
Attorney, Agent, or Firm—Foley & Lardner

[57] ABSTRACT

A resin seal type semiconductor device comprises a lead frame having a support and a plurality of leads, a semiconductor chip mounted on the die support and having a plurality of pads connected to the leads. Furthermore, the device has a wire lead arranged above the semiconductor chip. For example, power source is supplied from the lead supplying power source to one of the pads receiving power source, by connecting the lead and the one pad. Furthermore, power source is supplied from the lead to another pad located far from the one pad by connecting the lead and the another pad through the wire lead.

4 Claims, 5 Drawing Sheets

RESIN SEAL TYPE SEMICONDUCTOR DEVICE

BACKGROUND OF THE INVENTION

The present invention relates to a resin seal type semiconductor device, and more particularly, to a semiconductor device which supplies electric signals or electric potential from one lead to several pads located away from each other.

As shown in FIGS. 8 and 9, a resin seal type semiconductor device such as DIP (Dual Inline Package) is known.

A rectangular die support 3 is held at the central portion of a pair of parallel frame bodies 2 through hanging pins 4. A plurality of leads 5 which are terminals supplying electric signals are held by the frame bodies 2 through tie bars 6. The leads 5 are positioned along the periphery of the die support 3. A plating portion 7 is formed at the inner end of each lead 5 by gold-plating or silver-plating. A lead frame 1 is composed in this way. As shown in FIG. 9, a semiconductor chip 8 having a plurality of electrode pads 9 along the periphery thereof, is mounted on the central portion of the die support 3.

In this condition, each electrode pad 9 provided along the periphery of the semiconductor chip 8 and the corresponding plating portion 7 formed at the inner end of each lead 5 are connected by a bonding wire. Next, the whole arrangement except for the outer portions of the leads 5 are resin sealed by mold resin 11. Then, the leads 5 and the hanging pins 4 are cut off from the frame bodies 2, and after that, the tie bars 6 are removed and the leads 5 are bent, so that the semiconductor device is composed.

In FIG. 11, the mount paste 12 which glues the semiconductor chip 8 to the die support 3, is conductive on non-conductive adhesive.

Recently, many semiconductor chips having minute wires have been made because of the reduction of the size of the semiconductor chip, so that the wire resistance becomes high and the problem of noise occurs. In particular, it is required to reduce the size of the power supply wires of the semiconductor chip because the power supply wires occupy the greatest part of the area of the semiconductor chip. In this case, the problem of noise is more liable to happen.

When the problem of noise occurs, it is difficult to speed up the operation of the semiconductor device.

In order to solve the situation, it has been proposed that several pads receiving power source (power supply pads) are provided on the semiconductor chip, each power supply pad and lead supplying power source (power supply lead) being electrically connected so that the length of the power supply wires from each power supply pad becomes short. In this way, the wire resistance of the power supply wires of the semiconductor chip may become low.

However, when there is one power supply lead and several power supply pads located far from each other on the semiconductor chip such as when, for example when one power supply pad is located close to the power supply lead, and another power supply pad is located opposite the power supply lead, it is impossible to draw the power supply lead to the another power supply pad because of interference of the other leads, and it is therefore impossible to compose such a semiconductor device.

Incidentally, in addition to the relationship between one power supply lead and several power supply pads, the same situation may occur with respect to the relationship between one lead supplying signals and several electrode pads.

SUMMARY OF THE INVENTION

It is an object of the present invention to provide a resin seal type of semiconductor device in which it is possible to compose the semiconductor device when several pads which receive power source or signals from one lead are located far from each other.

The foregoing object is accomplished by providing a resin seal type semiconductor device comprising: a lead frame having a die support on the central portion of the lead frame and a plurality of leads arranged of the outer side of the die support; a semiconductor chip mounted on the die support and having a plurality of pads connected to the leads; a wire lead arranged above the semiconductor chip and connecting the leads and the pads; and mold resin sealing the lead frame, the semiconductor chip, and the wire lead.

According to the present invention, for example, power source is supplied from one of the leads supplying power source to one of the pads receiving power source by connecting the one lead and the one pad, and power source is supplied from the one lead to another pad located far from the one pad by connecting the one lead and the another pad through the wire lead. Accordingly, it is possible to supply power source or signals from one lead to several pads located far from each other.

DETAILED DESCRIPTION OF THE PREFERRED EMBODIMENTS

An embodiment of a resin seal type semiconductor device of the present invention will become understood from the following detailed description referring to the accompanying drawings, FIGS. 1-7.

Figure 1:
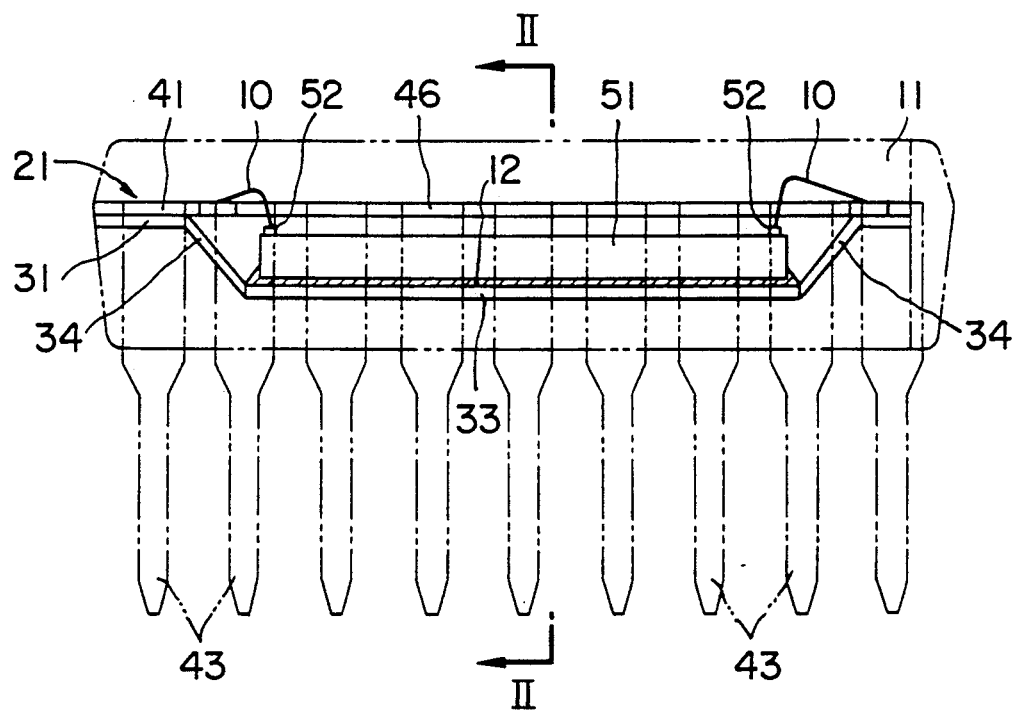
FIG. 1 is a perspective view of a resin seal type semiconductor device according to the present invention.
Figure 2:
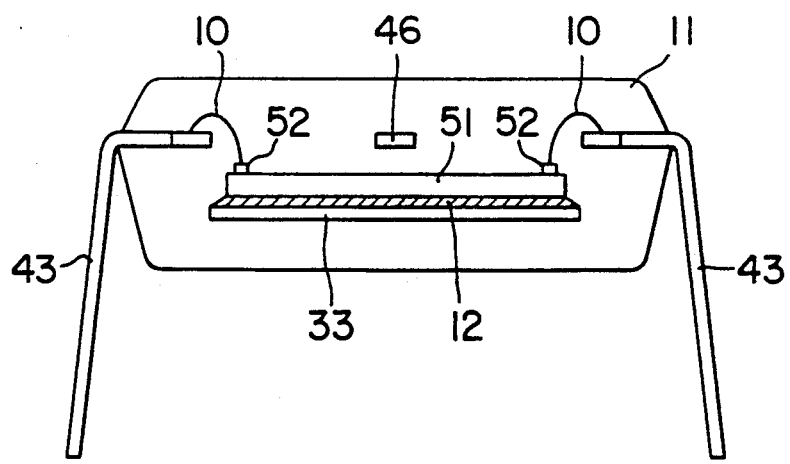
FIG. 2 is a cross-sectional view taken on line II—II of FIG. 1.

As shown in FIGS. 1 and 2, a rectangular die support 33 is held by a lead frame 21 through a pair of hang pins 34. A semiconductor chip 51 is mounted on the central portion of the die support 33 through mount paste 12. Each lead 43 of the lead frame 21 is connected to an electrode pad 52 of the semiconductor chip 51 through a bonding wire 10. A wire lead 46 of the lead frame 21 is positioned above the semiconductor chip 51. The semiconductor chip 51 is entirely resin sealed by mold resin 11.

Figure 3:
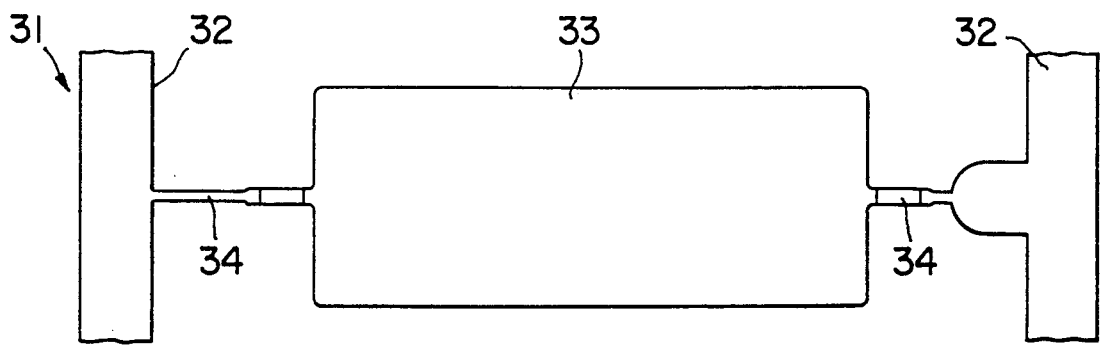
FIG. 3 is a plan view showing a bed frame.
Figure 4:
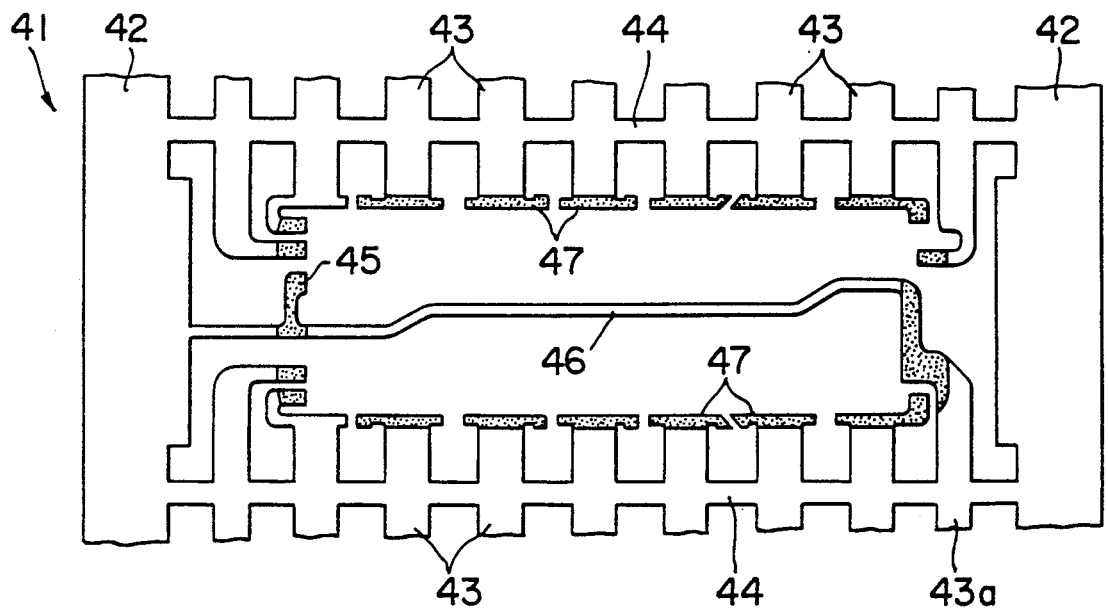
FIG. 4 is a plan view showing a wire frame.

The lead frame 21 consists of a bed frame 31 as shown in FIG. 3, and a wire frame 41 as shown in FIG. 4 which is laid on the desirable position of the lead frame 31.

That is, the bed frame 31 is provided with a pair of parallel bed frame bodies 32 and the rectangular die support 33 which is held at the central portion of the bed frame bodies 32 by them through the hang pins 34. The plane of the die support 33 is positioned below the plane of the bed frame bodies 32 by bending the hang pins 34 downward.

The parallel wire frame bodies of the wire frame 41 hold a plurality of leads 43 through tie bars 44. The leads 43 are positioned along the periphery of the die support 33 when the wire frame 41 is laid on the bed frame 31. One of the leads 43 adjacent to the one wire frame body 42 power supply lead 43a supplying $V_{ss}$ electric potential (ground electric potential). A wire lead 46 is connected to the power supply lead 43a and is extended in a direction perpendicular to the wire frame bodies 42, to the other wire frame body 42. A bonding post 45 is formed at the portion of the wire lead 46 adjacent to the other wire frame body 42. A plating portion 47 is formed at the inner end of each lead 43 by gold-plating or silver plating. The bonding post 45 is also plated.

Figure 5:
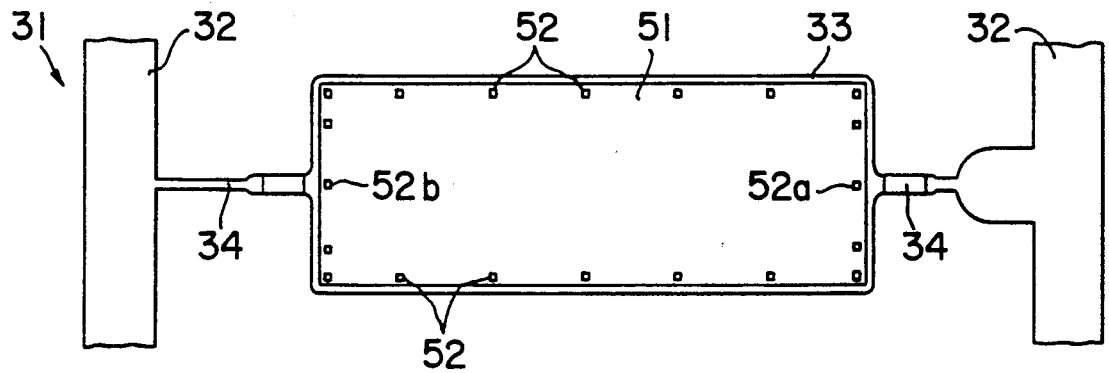
FIG. 5 is a plan view showing a semiconductor chip on the bed frame.

As shown in FIG. 5, the semiconductor chip 51 is provided with a plurality of electrode pads 52 along the periphery thereof. Two of the electrode pads 52 are $V_{ss}$ power supply pads 52a, 52b which are located longitudinally opposite to each other.

In this case where the power supply pads 52a, 52b are far from each other, the power supply pads 52a, 52b may not be connected to a power supply lead of a conventional lead frame, but may be connected to the power supply lead 43a of the present invention.

Figure 6:
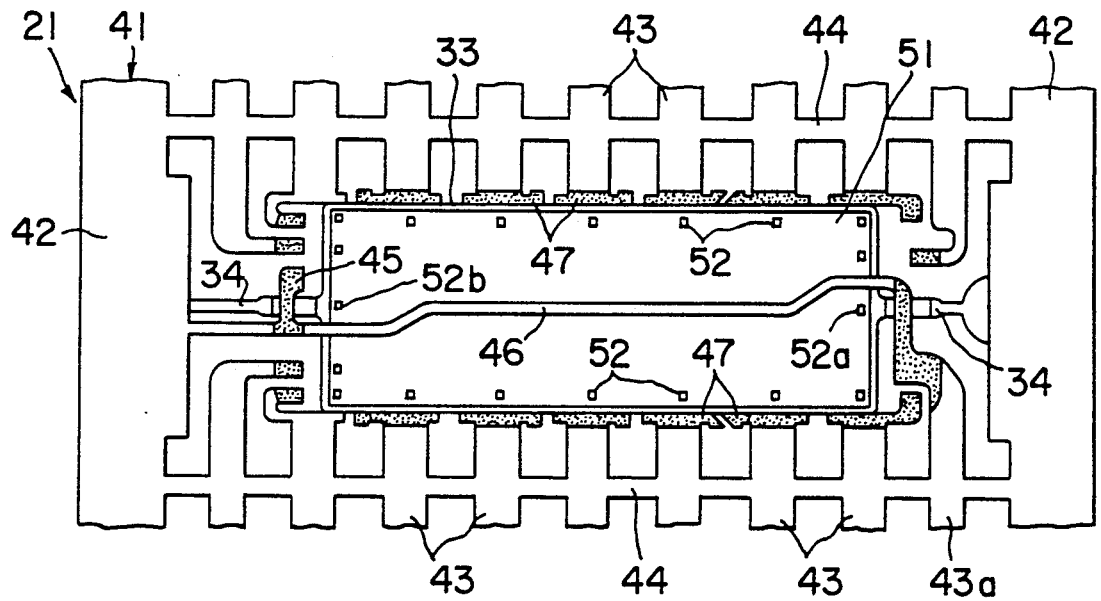
FIG. 6 is a plan view showing the wire frame laid on the bed frame.

In FIG. 5, the semiconductor chip 51 is mounted on the central portion of the die support 33 of the bed frame 31 through mount paste 12. In FIG. 6, the wire frame 41 is laid on the bed frame 31 in a manner where the wire frame body 42 is fitted to the predetermined portion of the bed frame body 32, after that the wire frame body 32 is fixed to the bed frame body 32, for example by a welding machine.

In this way, the lead frame 21 is composed of two frames, namely the bed frame 31 and the wire frame 41. Furthermore, the semiconductor chip 51 is mounted on the die support 33, and each lead 43 is positioned at the upper and outer side of each electrode pad 52 of the semiconductor chip 51. The wire lead 46 is crossed above the semiconductor chip 51.

In this case, the power supply lead 43a is positioned at the outer side of the power supply pad 52a, and the wire lead 46 connected to the power supply lead 43a is drawn above the semiconductor chip 51 to the opposite side of the power supply lead 43a without the interference of any other lead 43. The bonding post 45 provided at the wire lead 46 may reach reasonably close to the power supply pad 52b.

Figure 7:
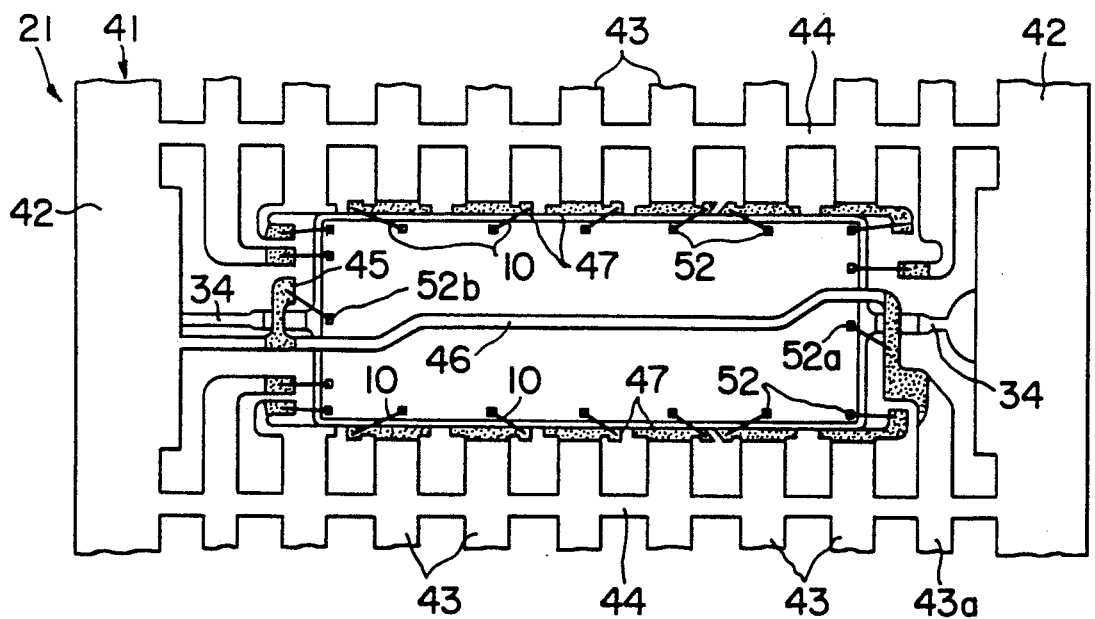
FIG. 7 is a plan view similar to FIG. 6 showing the wire frame and the bed frame where wire bonding is made.
Figure 8:
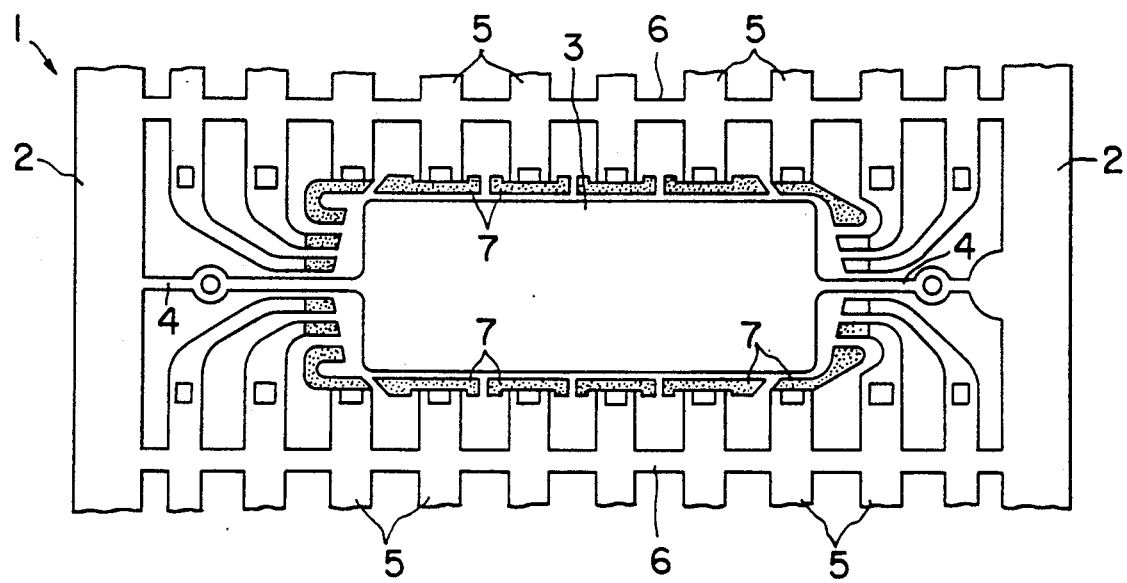
FIG. 8 is a plan view showing a conventional lead frame.
Figure 9:
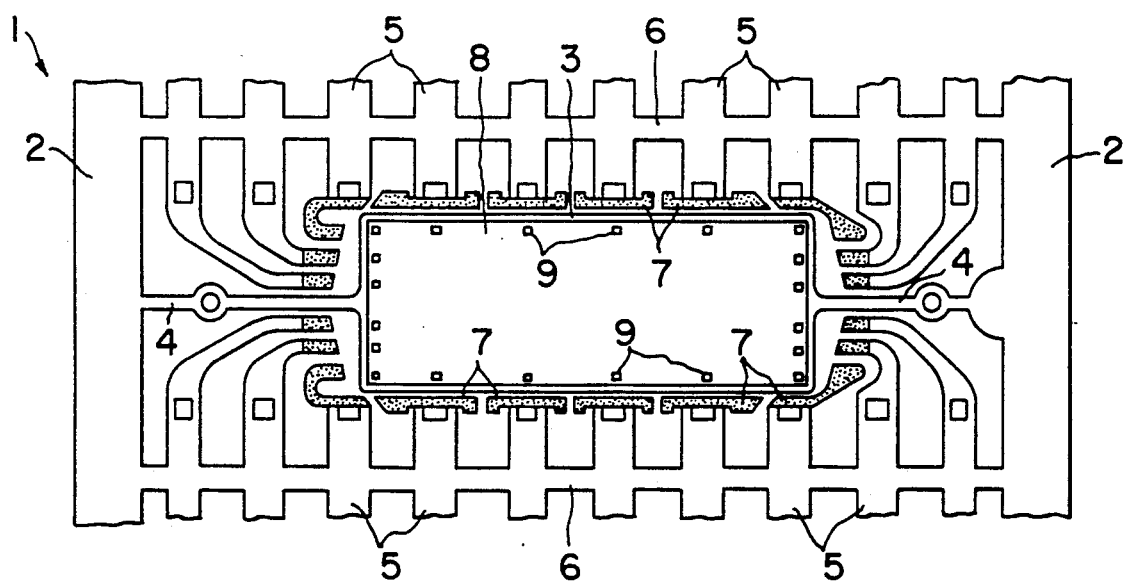
FIG. 9 is a plan view showing a conventional semiconductor chip laid on the lead frame.
Figure 10:
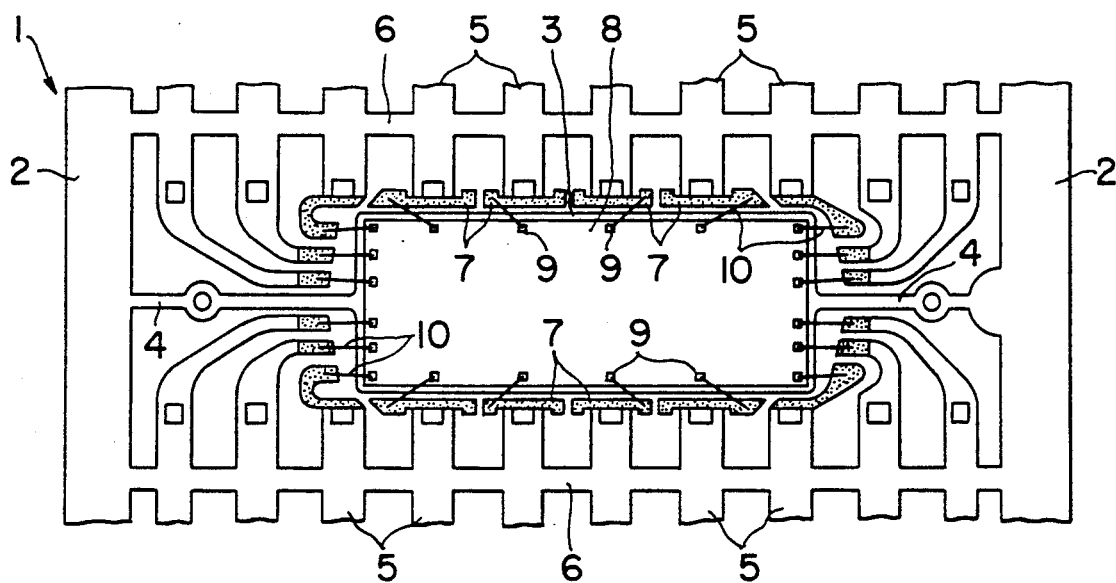
FIG. 10 is a plan view similar to FIG. 9, showing the semiconductor chip and the lead frame where wire bonding is performed.
Figure 11:
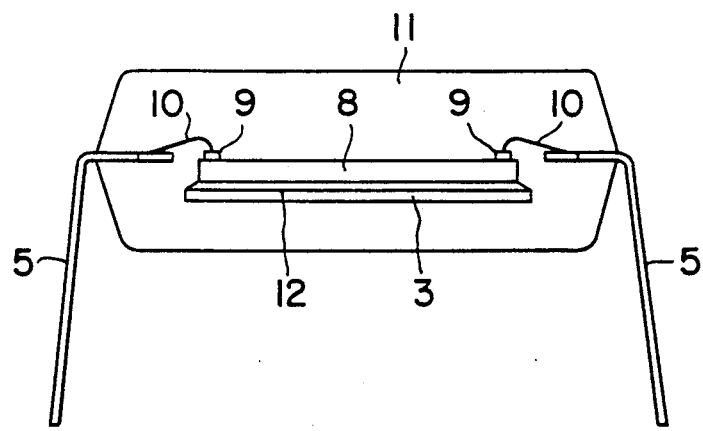
FIG. 11 is a cross-sectional view similar to FIG. 2 showing a conventional semiconductor device.

Accordingly, as shown in FIG. 7, $V_{ss}$ electric potential is supplied to the power supply pad 52a by connecting the power supply lead 43a and the power supply pad 52a through the bonding wire 10. As the wire lead 46 is connected to the power supply lead 43a, the electric potential of the wire lead 46 is $V_{ss}$ electric potential. Accordingly, $V_{ss}$ electric potential is also supplied to the power supply pad 52b by connecting the bonding post 45 of the wire lead 46 and the power supply pad 52b through the bonding wire 10.

Thus, $V_{ss}$ electric potential is supplied to the power supply pad 52a of the semiconductor chip 51 which is located close to the power supply lead 43a supplying $V_{ss}$ electric potential by connecting the power supply pad 52a and the power supply lead 43a. Furthermore, $V_{ss}$ electric potential is supplied from the power supply lead 43a to another power supply pad 52b located far from the power supply pad 52a by connecting the power supply pad 52b and the power supply lead 43a through the wire lead 46 which is arranged above the semiconductor chip 51 so as not to come into contact with the other lead 43. After that as shown in FIG. 7, the other electrode pads 52 are connected to the plating portions 47 of the leads 43.

Next, the whole arrangement except for the outer portions of the leads 43 and the power supply lead 43a are resin sealed by mold resin 11. Then, the leads 43, the power supply lead 43a, the hanging pins 34 and the wire lead 46 are cut off from the bed frame body 32 and the wire frame body 42. After that, the tie bars 44 are removed and the leads 43 and the power supply lead 43a are bent, so that the resin seal type semiconductor device of the present invention is composed.

Although it is described that $V_{ss}$ electric potential is supplied from one power supply lead 43a to two power supply pads 52a, 52b in the above-mentioned embodiment, in the case where there are several power supply pads close to either the power supply lead 43a or the bonding post 45, the several power supply pads may be independently connected to the power supply lead 43a or the bonding post 45 through bonding wires 10.

Although it is described that $V_{ss}$ electric potential is supplied to the power supply pads 52a, 52b through the wire lead 46, electric signals from one of the leads 43 may be supplied to several electrode pads 52 through the wire lead 46 which connects the lead 43 and the electrode pads 52.

Furthermore, not only one wire lead 46 but also more than two wire leads 46 may be used. In the case of more than two wire leads 46, it is necessary to arrange the wire leads 46 so that the wire leads 46 are out of contact with each other by providing height differences between the wire leads 46 or by spacing the wire leads 46.

What is claimed is:

1. A resin seal type semiconductor device comprising:
   a lead frame having a die support on the central portion of the lead frame and a plurality of leads arranged on the outer side of the die support;
   a semiconductor chip mounted on the die support and having a plurality of pads connected to the leads;
   a wire lead arranged above the semiconductor chip and connecting the leads and the pads; and
   mold resin sealing the lead frame, the semiconductor chip, and the wire lead.

2. The device as claimed in claim 1, wherein
   the lead frame consists of a bed frame having the die support, and a wire frame laid on the bed frame and having the leads and the wire lead.

3. The device as claimed in claim 1, wherein
   the wire lead connects one lead supplying power source and more than two pads located opposite each other and receiving power source.

4. The device as claimed in claim 1, wherein
   the wire lead connects one lead supplying signals and more than two pads located opposite each other and receiving signals.

* * * * *